(12) United States Patent
Mejia

(10) Patent No.: US 6,680,970 B1
(45) Date of Patent: Jan. 20, 2004

(54) STATISTICAL METHODS AND SYSTEMS FOR DATA RATE DETECTION FOR MULTI-SPEED EMBEDDED CLOCK SERIAL RECEIVERS

(75) Inventor: Robert G. Mejia, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/577,216

(22) Filed: May 23, 2000

(51) Int. Cl.[7] ............................. H04B 17/00; H04B 3/46
(52) U.S. Cl. ....................... 375/225; 375/326; 375/327; 375/360; 375/376
(58) Field of Search ................................ 375/225, 326, 375/327, 360, 376

(56) References Cited

U.S. PATENT DOCUMENTS

| | | | |
|---|---|---|---|
| 4,365,210 A | 12/1982 | Harrington et al. | 331/1 A |
| 4,430,745 A * | 2/1984 | Betts | 375/377 |
| 4,546,486 A | 10/1985 | Evans | |
| 4,932,041 A | 6/1990 | Eiberger et al. | |
| 5,131,015 A * | 7/1992 | Benjaram et al. | 375/377 |
| 5,182,761 A | 1/1993 | Beyer et al. | |
| 5,387,911 A | 2/1995 | Gleichert et al. | 341/95 |
| 5,490,282 A | 2/1996 | Dreps et al. | 395/821 |
| 5,757,297 A | 5/1998 | Ferraiolo et al. | 341/100 |
| 5,761,255 A * | 6/1998 | Shi | 375/360 |
| 5,950,115 A | 9/1999 | Momtaz et al. | 455/73 |
| 6,067,335 A * | 5/2000 | Yamanoi et al. | 375/374 |
| 6,201,829 B1 * | 3/2001 | Schneider | 375/221 |

FOREIGN PATENT DOCUMENTS

JP 0918461 * 12/1997 ............. H04L/7/00

* cited by examiner

Primary Examiner—Don N. Vo
Assistant Examiner—Qutub Ghulamali

(57) ABSTRACT

Methods and systems for data rate detection for multi-speed embedded clock serial receivers are described. In one embodiment, a method of determining a data rate of a high speed serially transmitted data stream comprises statistically examining edge characteristics of the incoming data stream. Based on the edge characteristics, a signature is identified that is associated with the edge characteristics. Based on the identified signature, a data rate at which the data stream is being transmitted is determined. In one embodiment, a clock extraction/data recovery circuit is provided for recovering an embedded clock and data from a high speed serially transmitted data stream. The circuit comprises a phase comparator that is configured to receive a high speed serially transmitted data stream and output indicia whenever the data stream experiences a data transition. A voltage controlled oscillator (VCO) is connected with the phase comparator and provides a clock signal having clock edges. The clock signal is locked to the data stream. A data rate detection circuit is connected with the phase comparator and receives the series of pulses that are output by the phase comparator. Based on the received pulses, the data rate detection circuit ascertains a data rate at which the data stream is transmitted.

5 Claims, 6 Drawing Sheets

STATISTICAL METHODS AND SYSTEMS FOR DATA RATE DETECTION FOR MULTI-SPEED EMBEDDED CLOCK SERIAL RECEIVERS

TECHNICAL FIELD

The present invention relates to methods and systems for data rate detection for multi-speed embedded clock serial receivers.

BACKGROUND

The past few years have seen a dramatic increase in the speed of data transmission capabilities among and between the various components of a computer system or between multiple computer systems connected together in a network configuration. Indeed, since the general acceptance of personal computer systems, data transmission speeds have grown with an almost power law dependence; about 1 MHz in the '60's, 10 MHz in the '70's, 100 MHz in the '80's, and 1 GHz speeds being routinely achieved in the '90's.

The development of optical fiber for transmission of digital data streams has become a particular enabling technology for modern day 1 GHz data transmission speeds and, in the computer industry, has given rise to a data transfer protocol and interface system termed Fibre-Channel. Fibre-Channel technology involves coupling various computer systems together with optical fiber or an electrically conductive (copper) cable and allows extremely rapid data transmission speeds between machines separated by potentially great distances. However, because of the physical characteristics of these types of systems, data is typically transmitted in a serial-fashion. In contrast, computer systems are configured to almost universally handle data in parallel fashion on byte-multiple signal busses (8-bit, 16-bit or 32-bit busses), making it incumbent on any data transmission system to provide some means for converting a 1 GHz serial data stream into a byte or byte-multiple parallel data stream. Conversely, since the fibre channel protocol contemplates two-way data transmission, computer systems that typically operate with parallel data structures must have some means for serializing a byte or byte-multiple data stream into a 1 GHz data signal suitable for transmission down an optical fiber or an electrically conductive (copper) cable.

Parallel data being serialized for high speed transmission is typically synchronous, in that the sequence of 1's and 0's making up the resulting serial data stream occurs with reference to a synchronized, uniform, single-frequency serializer clock signal. Encoding and transmitting the clock signal, together with data, would necessarily require an inordinate amount of valuable serial bandwidth, require an extra line to carry the clock, and reduce the overall data transmission speed of a fibre channel system because of clock skew issues. Even though individual bit level self-clocking is inherent in the serial data stream, some method of evaluating the data stream must be used in order that a transceiver or serial-to-parallel data recovery system may determine how to appropriately frame the binary data stream into bytes.

In accordance with the Fibre-Channel 10-bit Interface specification, amplified in ANSI X3.230-1994 document, an encoded byte is 10-bits in length and is referred to as a transmission character. Data provided over a typical computer system's parallel architecture must be encoded and framed such that each data byte (8-bits from the point of view of the computer system) is formed into a transmission character, often termed a Fibre Channel 8B/10B encoded character. The resulting 8B/10B character must then be transmitted as 10 sequential bits at a 1.06 GHz data rate in accordance with the interface specification. Likewise, an incoming 8B/10B encoded transmission character must be received at a 1.06 GHz data rate and converted (framed) into the encoded 10 bit byte.

In the receiver case, many systems perform this function by using various types of clock recovery circuits, the most common of which is a phase-lock loop, which generates or regenerates a synchronous timing reference signal from a serial data stream and provides the timing reference to a data synchronizer or deserializer in order to mark-in time, the anticipated occurrence of a serial data bit. In effect, a phase-lock loop generates a synchronous stream of successive timing references, each timing reference representing, for example, a bit cell with which a data bit may be associated. For example, 10 consecutive timing references might represent a framed 8B/10B Fibre Channel transmission character which might then be latched out onto a 10-bit parallel bus by, for example, a deserializer comprising a 10-bit counter. Hence, a clock recovery circuit is an essential component in modern day GHz transceiver systems.

In like fashion, transmitter sections are configured to receive an 8B/10B encoded transmission character and convert the 10-bit byte into serial data and transmit the serialized data at a 1.06 GHz data rate.

The frequency of clock signals recovered by, for example, a receiver phase lock loop, is subject to a number of variations introduced by the electronic components of such systems, including transmission media effects. Typically, the electronic components in the data path introduce some elements of phase and frequency noise which are random in nature and, more particularly, have dramatically varying band width characteristics depending on the geometric and electronic variations in modern semiconductor manufacturing process parameters. A phase lock loop such as comprises a 1.06 GHz to 106 MHZ transceiver, must take these variations into account when attempting to deal with a 1.06 GHz serial data stream.

Implementations of such a transceiver, typically include at least a phase-locked loop (PLL) normally comprising a phase or phase and frequency detector, a charge pump, an analog filter, and some means for generating a synchronous clock signal, such as a voltage controlled oscillator (VCO).

During initialization, or power-on reset, during what is conventionally termed a frequency or velocity lock, the oscillation frequency of the VCO is determined by, and locked to, the frequency of an external clock provided for such purpose, just prior to receiving an incoming serial data stream. Once frequency or velocity lock is established, the VCO runs in what might be termed a quasi-flywheel mode at a mean frequency determined during velocity lock. Subsequent correction control to the VCO frequency is developed by phase-locking a transition edge of the synchronous VCO signal to a transition edge of the data ONE bits of an incoming serial data signal. Typically, both rising and falling edges can be used to make phase comparisons. The VCO is phase-locked to the incoming serial data stream by comparing the phase of the rising edge of the VCO clock signal to the phase of the rising edge of a data ONE bit, in a phase detector. Phase or time differences detected between the two rising edges causes a control signal to be issued to a charge pump which either pumps-up or pumps-down the VCO, thus directing the VCO to either speed up or slow down in response to frequency variation in the data stream.

An analog low pass filter is typically provided between the charge pump and the VCO to reject corrections resulting from random high-frequency variations of individual data bytes, and allow ideally only corrections resulting from consistent frequency shifts of the data stream. The filter is also used to provide for loop stability. The VCO is therefore locked to the mean phase of the data stream rather than to the phase of a particular data bit. Once phase-locked, the synchronous VCO signal provides for a recovered clock signal whose rate (frequency) is equal to the data bit rate or an integral multiple thereof.

Some receivers are capable of receiving data at multiple bit rates. Typically, the rates are even multiples of one another, e.g. factors of 2. The receiver must be able to determine the bit rate or data rate, lock a local clock to the data and perform word alignment. Data streams typically possess timing jitter and frequency variations that behave in an asynchronous and/or random manner. Data of one bit rate will often appear as legitimate data at another rate. These two factors can combine to make speed detection very difficult. Consider, for example, a bit pattern of 00110011. This bit pattern, when considered from the point of view of a higher bit rate, can be identical to the bit pattern 0101 at a lower rate.

Thus, a problem exists not being able to easily and automatically detect two or more different data rates in a robust manner. While attempts have been made in the past, they fall short of the mark of providing an automatic robust method. For example, one past system will typically assume that data is being received at a certain rate, e.g. the higher of two rates. The system will then analyze the data at the assumed rate to see if it can be successfully interpreted and follows the higher levels of transmission protocol. If the data does not make sense at the higher rate, then the lower rate will be used to analyze the data. This approach can be inefficient, especially in loop architectures where several nodes in a daisy chain sequentially detect their input data rate.

Accordingly, this invention arose out of concerns associated with providing improved methods and systems for data rate detection for multi-speed embedded clock serial receivers.

SUMMARY

Methods and systems for data rate detection for multi-speed embedded clock serial receivers are described.

In one embodiment, a method of determining a data rate of a high speed serially transmitted data stream comprises statistically examining edge timing characteristics of the incoming data stream. Based on the edge characteristics, a signature is identified that is associated with the edge characteristics. Based on the identified signature, a data rate at which the data stream is being transmitted is determined.

In another embodiment, a method of determining a data rate of a high speed serially transmitted data stream comprises providing a clock signal at a first data rate. The clock signal has clock edges that are locked to data transitions of an incoming data stream. The method discriminates between data transitions that occur on odd and even clock edges and determines whether the data transitions occur, on average, on only one of odd or even clock edges, or whether the data transitions occur, on average, on both odd and even clock edges. Based on where the data transitions occur, the method ascertains a data rate of the incoming data.

In yet another embodiment, a clock extraction/data recovery circuit is provided for recovering an embedded clock and data from a high speed serially transmitted data stream. The circuit comprises a phase comparator that is configured to receive a high speed serially transmitted data stream and output indicia whenever the data stream experiences a data transition. A voltage controlled oscillator (VCO) is connected with the phase comparator and provides a clock signal having clock edges. The clock signal is locked to the data stream. A data rate detection circuit is connected with the phase comparator and receives the indicia that are output by the phase comparator. Based on the received indicia, the data rate detection circuit ascertains a data rate at which the data stream is transmitted.

DETAILED DESCRIPTION

Overview

The methods and systems about to be described provide a statistical approach to ascertaining data rates in various high speed data transmission schemes. The methods and systems are robust, accurate and do not rely on trial and error methods, as past methods have. As a result, data rates can be ascertained quickly and efficiently. The methods and systems are well suited to distinguish between multiple different data rates that might appear, to some systems, as indistinguishable, i.e. a bit stream of 0011001100 at one data rate versus a bit stream of 01010 at a second data rate.

In certain described embodiments, the edges that constitute data transitions (e.g. transitioning from a 0 to a 1 or from a 1 to a 0) for an incoming data stream are statistically examined over time. By "statistical" is meant that the embodiments rely on the principles of statistics in order to make an intelligent decision regarding the data rate. One definition of "statistics" is that it is the science that deals with the collection, classification, analysis, and interpretation of numerical facts or data, and that, by use of mathematical theories of probability, imposes order and regularity on aggregates of more or less disparate elements.

Certain underlying assumptions are made regarding edge characteristics at the various data rates that are possible. For example, edge characteristics at one data rate can have a unique signature that identifies them over edge characteristics at another data rate. Thus, if incoming data exhibits certain edge characteristics when statistically examined, then conclusions can be made about the data rate of the incoming data. Accordingly, by observing the edges or edge characteristics of the incoming data, data rates can be identified with a desirable degree of certainty.

Figure 1:
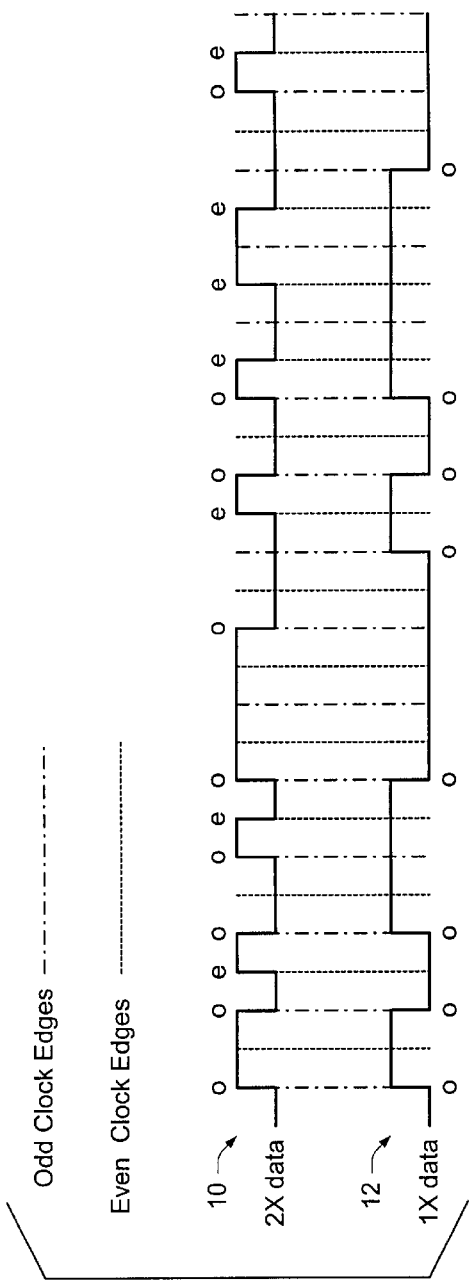
FIG. 1 is a diagram that illustrates a pair of data streams having different data rates superimposed over a clock signal and is useful in understanding certain principles of the described embodiments.

As an example, consider FIG. 1 which shows two exemplary data patterns 10, 12. Data pattern 10 represents data that is received a higher data rate (in this particular example, 2×) than data that is represented by data pattern 12. Specifically, the data rate of pattern 10 is two times faster than the data rate for data pattern 12. An exemplary system in which the above data patterns might be found is a Fibre Channel system that utilizes 8B/10B encoding. It will be appreciated, however, that the subject matter claimed herein should not be limited only to such systems. Additionally, while the examples that follow make use of two exemplary different data rates, it will be appreciated that the principles discussed herein are applicable to systems in which there might be more than two possible data rates, i.e. three or more. It should also be appreciated that while the example given below is given in the context of a higher data rate that is two times the data rate of the lower data rate, other data rate differentials could be employed, e.g. 3×, 4× and the like.

The reader will notice that vertical lines in FIG. 1 (dash-dot-dash, and dotted lines) coincide with many edges (i.e. data transitions) of the data patterns. These vertical lines represent the clock edges of a clock signal that is provided at a rate that is equal to the higher data rate (i.e. the data rate of pattern 10). The clock signal has been locked to the edges of the data patterns. As can be seen, each data transition for either pattern is coincident with a clock edge. But notice where the data transitions take place for each data pattern 10, 12. For data pattern 10, the data transitions take place at both even and odd clock edges, while the data transitions for data pattern 12 take place at either odd or even clock edges, but not both. In the illustrated example, the odd edges are designated by a "o" and the even clock edges are identified by a "e". Numerically, the odd clock edges are the first, third, fifth, seventh, etc. clock edges, while the even clock edges are the second, fourth, sixth, eighth, etc, clock edges.

In one of the described embodiments, data rates are identified by statistically examining the occurrence of these data transitions over time. Specifically, those data patterns whose data transitions are found to occur on both odd and even clock edges can be assumed to be data at a higher data rate. Conversely, those data patterns whose data transitions are found to occur on only odd or even clock edges (but not both) can be assumed to be data at the lower data rate. Of course, there can be some divergence from this rule. The divergence can be dealt with by defining tolerances that permit some variation yet still satisfy the rule. For example, a particular data stream might exhibit the characteristics of a lower rate, yet there might be some data transitions on both even and odd VCO clock edges. In this case, there might be a tolerance that allows for a certain percentage of even and odd clock edge data transitions, due to signal noise and distortions, while still allowing for a determination of the lower rate. Importantly, what this embodiment recognizes is that the edge characteristics, e.g. timing and placement, of the incoming data holds clues that can be statistically used to make an intelligent decision regarding the data rate.

The statistical approach is very different from past methods that have used pattern recognition or trial and error methods. In pattern recognition cases, only certain portions of the incoming data stream are examined in the hopes that a matching pattern can be found. If a pattern is not found in a portion of the data stream, that portion is essentially discarded and a new portion of the data stream is examined. The discarded data portion is not typically used in further determinations. The statistical approach is different from this approach because it looks at all of the data over time and uses all of the data to make a determination as to the data rate. None of the data is discarded because it is all important is facilitating the analysis that makes it possible to make an intelligent determination regarding the data rate. With respect to the trial and error method, this approach essentially uses the incoming data to either prove or disprove an assumption that is made regarding the data rate. In the statistical approach, no assumptions are made regarding the actual rate of the incoming data. Rather, the incoming data is analyzed and from the analysis a determination of the data rate is made.

Exemplary Method

Figure 2:
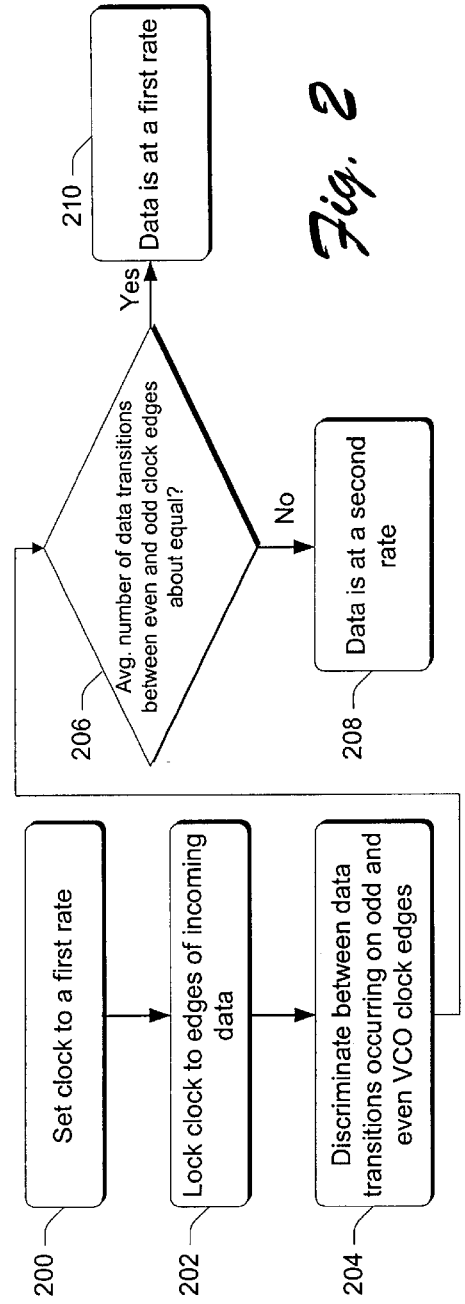
FIG. 2 is a flow diagram that describes steps in a data rate detection method in accordance with a described embodiment.

FIG. 2 is a flow diagram that describes steps in a data rate determination method in accordance with one described embodiment. While the method can be implemented in any suitable hardware, software, firmware, or combination thereof, in the field of high speed serial data transmission, the method is advantageously implemented in suitable hardware. The steps of the described method are advantageously implemented by a receiver that receives the high speed serial data transmission.

Step 200 sets a clock to a first data rate. In this example, the receiver includes a VCO and this step is implemented by setting the VCO to the higher of two possible data rates. Step 202 then locks the VCO clock signal to the edges of the incoming data stream. Step 204 discriminates between data transitions that occur on odd and even VCO clock edges. This step is advantageously implemented by a phase comparator that comprises part of a phase locked loop, an example of which is given below. Step 206 determines whether the average number of data transitions that occur on even and odd VCO clock edges, over time, are about equal. If the data transitions that occur on even and odd VCO edges are about equal over time, then step 208 concludes that the data is at the first (higher) data rate. If, on the other hand, the data transitions that occur on the even and odd edges are not about equal (i.e. most or all of the transitions occur on one or the other, but not both), then step 210 concludes that the data is at the second (lower) data rate.

Hence, by statistically examining the edge characteristics of the incoming data stream, an intelligent decision can be made as to the data rate of the data stream. It will be appreciated that measures can be taken to provide a degree of tolerance for slight variations in the characteristics of the edges of the data stream.

Exemplary Circuit Implementations

Figure 3:
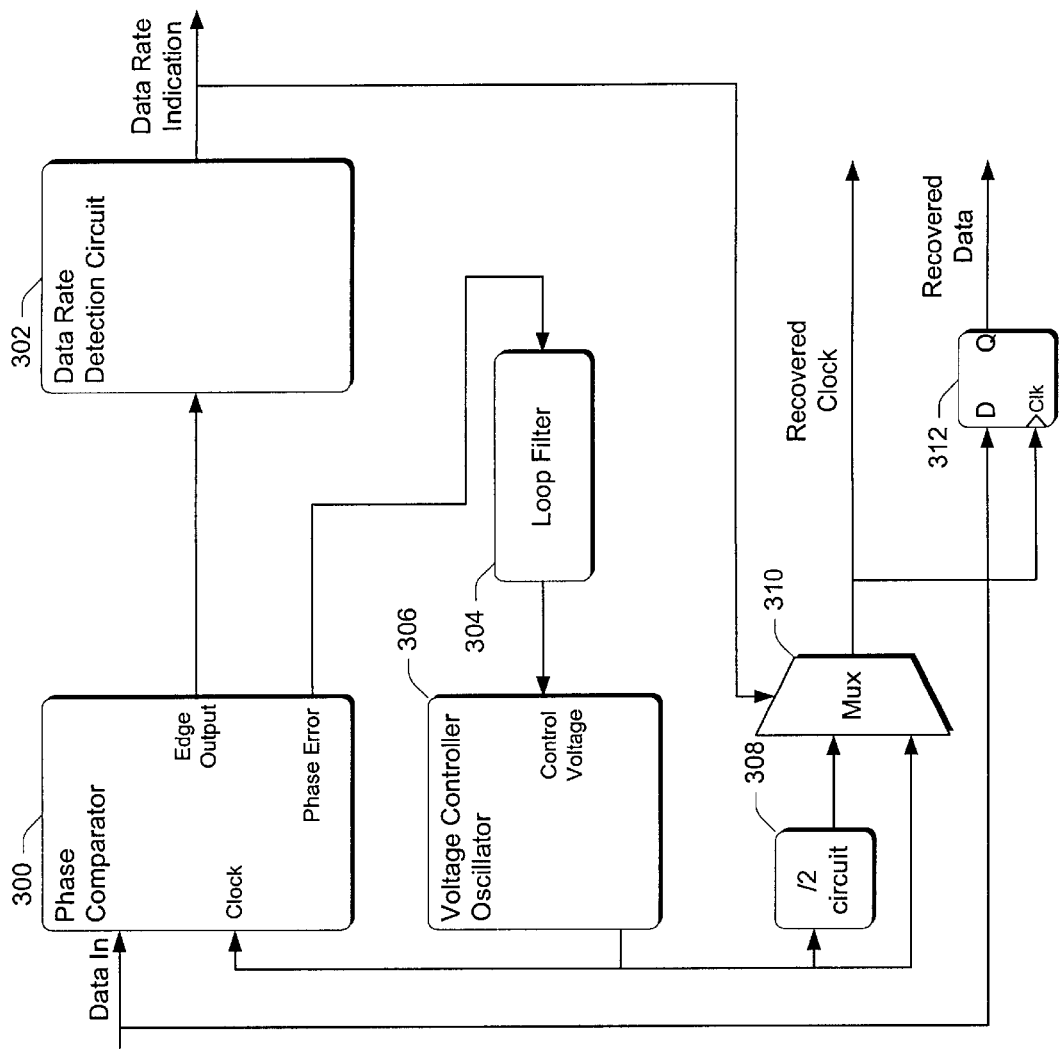
FIG. 3 is a high level block diagram of a clock and data recovery circuit in accordance with one embodiment.

FIG. 3 shows a high level block diagram of an exemplary clock extraction and data recovery circuit. This circuit can be utilized to recover an embedded clock and data in an incoming data stream that is capable of being transmitted at different rates or speeds.

The circuit comprises a phase comparator 300 that is coupled with a data rate detection circuit 302. A loop filter 304 and VCO 306 are connected as shown. The clock extraction and data recovery circuit also includes a divide-by-two circuit 308, a multiplexer 310 and a flip flop 312. Other circuit elements can, of course, be utilized without departing from the spirit and scope of the invention.

In the FIG. 3 circuit arrangement, VCO 306 provides a clock signal that is provided at a higher of the expected data rates. This clock signal is fed to clock input of the phase comparator 300 which locks the VCO clock to the incoming data stream. The phase comparator includes a phase error output which is fed through loop filter 304 to provide a control voltage that is utilized to keep the VCO clock signal locked to the incoming data stream in a conventional manner. In this example, the phase comparator includes an edge output that is fed to the data rate detection circuit 302. The data rate detection circuit 302 is advantageously configured to ascertain the data rate of the data stream that is received by the phase comparator 300. In this illustrated example, the phase comparator is configured to output indicia, e.g. a pulse, via the edge output whenever the incoming data stream experiences a data transition. The data rate detection circuit 302 is able to ascertain whether the pulse occurs on an odd or even clock edge. By ascertaining whether the data transitions take place on even or odd clock edges, and by tracking the occurrences thereof over time, the data rate detection circuit 302 can identify, with a reasonable degree of certainty, which one of multiple data rates is present at the data input of the phase comparator 300.

A data rate indication is output by the data rate detection circuit 302 and is manifest in a signal that is fed to multiplexer 310. The multiplexer 310 has two inputs, each of which corresponds to one of the multiple data rates. The divide-by-two circuit 308 divides the clock output of VCO 306 by two to provide the lower of the data rates as an input, while the other of the inputs comes directly from the VCO and constitutes the higher of the data rates. Depending on the data rate indication from data rate detection circuit 302, one of the two data rates is utilized to recover the clock. The output of multiplexer 310 (i.e. the recovered clock) is then input to one of the inputs of flip flop 312. The other of the flip flop's inputs is the incoming data stream. The flip flop can then be used to recover the data in a conventional manner.

Figure 4:
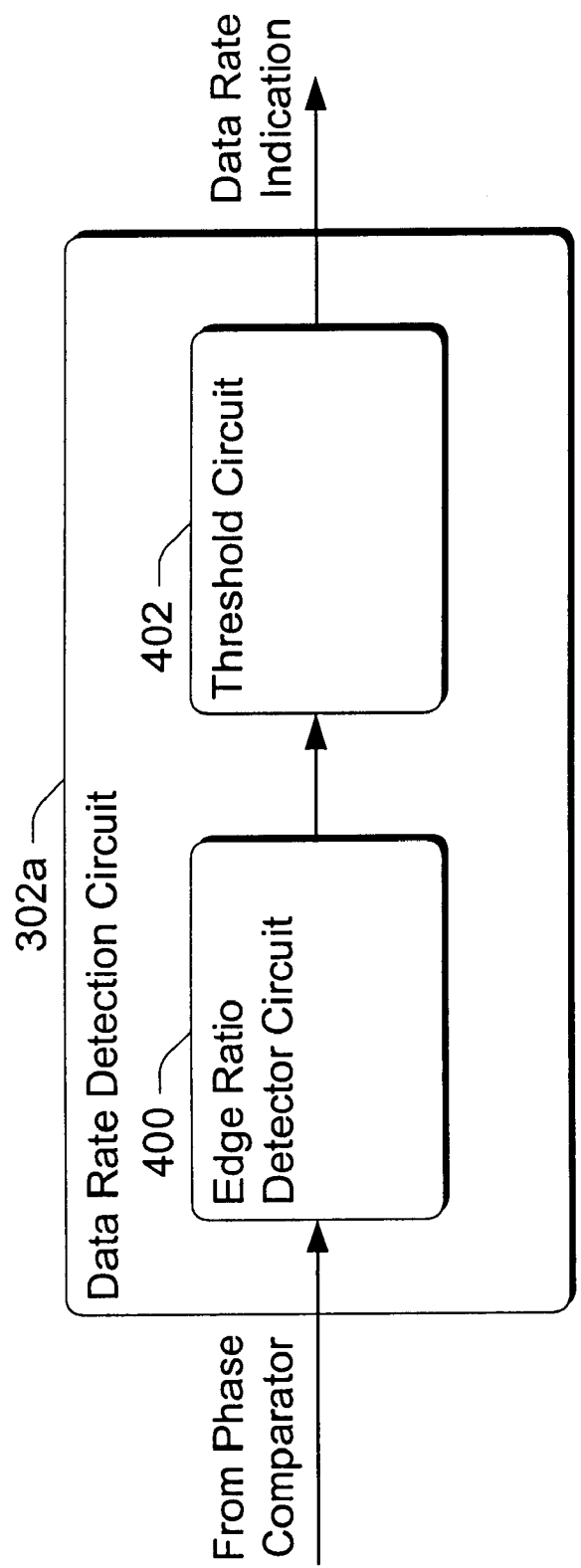
FIG. 4 is a block diagram of a data rate detection circuit in accordance with one embodiment.

FIG. 4 shows an exemplary data rate detection circuit 302a that includes an edge ratio detector circuit 400 and a threshold circuit 402. The edge ratio detector circuit 400 receives its input from the phase comparator which outputs a pulse every time there is a data transition in the incoming data stream. The edge ratio detector circuit is either able to ascertain whether the pulses occur on even or odd VCO clock edges, or the clock pulses are provided to the edge ratio detector circuit in such a way that it is apparent where the data transitions occur. For example, in the latter case, the phase comparator can be configured to output a pulse via a first output every time a data transition takes place on an even VCO clock edges, and output a pulse via a second output every time a data transition takes place on an odd VCO clock edge. Hence, edge ratio detector circuit 400 would not have to determine where the data transitions take place. Rather, the edge ratio detector circuit would simply keep track of or average the data transitions over time. The edge ratio circuit can compute a ratio of even-to-odd edge data transitions. The threshold circuit 402 receives an input from the edge detector circuit 400 which, in this example, is a ratio of the even-to-odd edge data transitions. Any suitable circuit can be used to implement the edge ratio detector.

The threshold circuit 402 is advantageously configured to determine the data rate based upon the information that is provided to it by the edge detector circuit 400. For example, if the ratio of even-to-odd edge data transitions is somewhere a round one to one, then the average number of data transitions between even and odd VCO clock edges is essentially equal. This means that the data rate is likely the higher of the two data rates. Alternately, if the ratio is a value other than one to one, e.g. 7/8, then it may be likely that the data rate is the lower of the two data rates. In the described embodiment, the threshold circuit 402 is configured to ascertain with a desirable degree of certainty which of the two data rates is present at the input of the phase comparator 300. Once the data rate is determined by the threshold circuit 402, a data rate indication can be utilized as described above in connection with FIG. 3.

Figure 5:
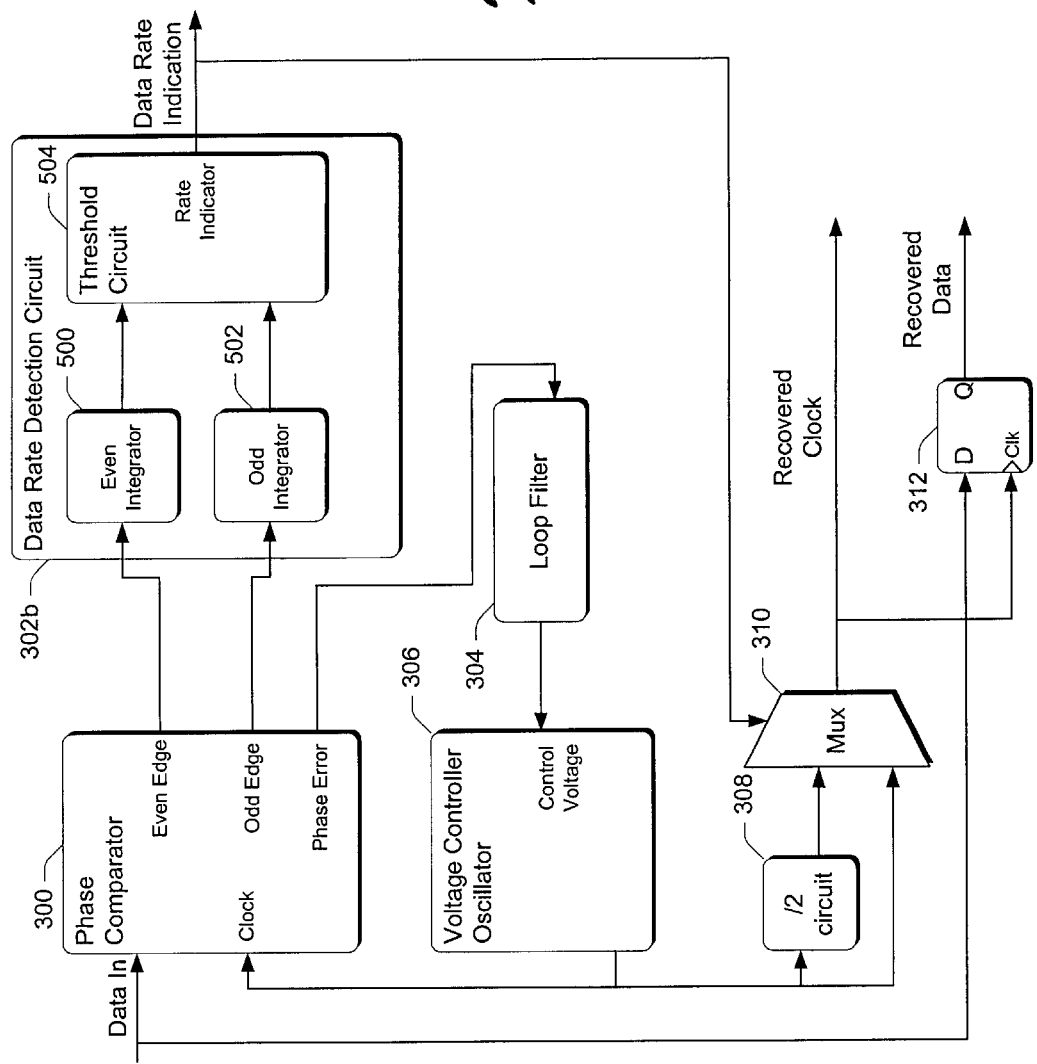
FIG. 5 is a high level block diagram of a clock and data recovery circuit in accordance with one embodiment.

FIG. 5 shows another exemplary clock extraction and data recovery circuit. Like numerals from the FIG. 3 embodiment are utilized where appropriate, with differences being indicated with different numerals. Here, the phase comparator has two outputs, one of which is associated with the even edges of the VCO clock signal, the other of which is associated with the odd edges of the VCO clock signal. When the data stream experiences a data transition on an even VCO clock edge, a pulse is output on the even edge output line. Similarly, when the data stream experiences a data transition on an odd VCO clock edge, a pulse is output on the odd edge outline line. These outputs are respectively provided to a pair of integrator circuits, here even integrator 500 and odd integrator 502. Any suitable integration circuits can be utilized for the integrators. The integrators collectively keep track of, on average, how many of each type of edge (even or odd) has been the subject of a data transition by the data stream. The output of each integrator is a voltage that is proportional to the density, in time, of the pulses that are received by the integrators. The threshold circuit 504 receives these voltages and processes them to determine or ascertain a data rate. For example, the threshold circuit can compare the voltages and make a decision based on the comparison. The threshold circuit might also compute a ratio of the even-to-odd edges and, based upon the computed ratio, make a decision as to the data rate. The rest of the clock extraction and data recovery circuit operates substantially as described above.

It should be appreciated that although specific circuitry is shown in this figure to enable a data rate to be determined based upon the edge characteristics of the data stream that is received by the phase comparator, other circuitry could be used without departing from the spirit and scope of the invention. For example, instead of the illustrated integrators 500, 502, various high speed counters could be used to track the data transitions. Specifically, an up/down counter might be employed where, when an even edge transition is encountered the counter is incremented and when an odd edge transition is encountered the counter is decremented. If the counter stays in one place, then it can be assumed that there is a fairly even mix of even and odd edge data transitions thereby indicating the higher data rate. If, on the other hand, the counter counts in a specific direction for a definable period of time, then it can be assumed that there is a fairly uneven mix of even and odd edge data transitions thereby indicating the lower rate. In the up/down counter approach, it is possible that the counter would continuously cycle even with legal data patterns, however, the rate at which the counter cycles would be constrained. So, if the counter cycled at a rate higher than a threshold rate, this would indicate the lower rate.

Figure 6:
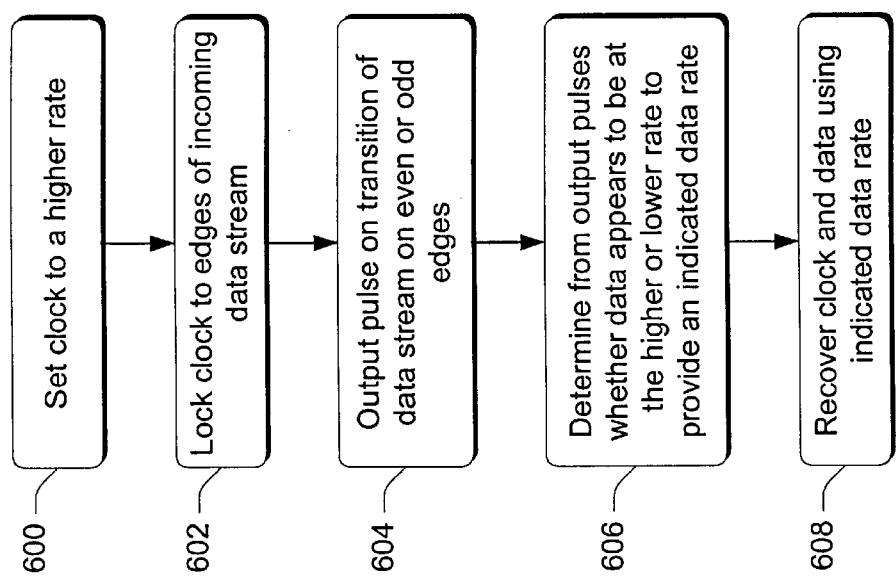
FIG. 6 is a flow diagram that describes steps in a data rate detection method in accordance with a described embodiment.

FIG. 6 is a flow diagram that illustrates steps in a data rate determination method in accordance with the described embodiment. The illustrated steps can be implemented in accordance with the circuitry shown in FIG. 5.

Step 600 sets a clock to the higher of two data rates. In the illustrated example, such would comprise setting the VCO clock to the 2× data rate. Step 602 locks the clock edges to the edges of the incoming data. Step 604 outputs a pulse when the data transitions on even or odd edges of the clock. In the illustrated example, separate pulses are emitted for the data transitions on the even and the odd VCO clock edges.

In the illustrated example, this step is implemented by the phase comparator 300. Step 606 determines, from the output pulses, whether the data appears to be at the higher or lower data rate to provide an indicated data rate. In the illustrated example, this step is implemented by the data rate detection circuit 302a (FIG. 4), a specific example of which is given in FIG. 5. Step 608 then recovers the clock and data from the input data stream using the indicated data rate. This step is implemented by multiplexer 310 and flip flop 312 (FIGS. 3 and 5).

It should also be appreciated that while the above description represents a hardware solution, it is possible that, in some scenarios, the components might be implemented in software or firmware.

An Exemplary Optimization

Consider that a characteristic of various data rates of certain encoding schemes that facilitates its determination when a particular data stream's data rate is unknown, is that data transitions can be ascertained to occur with a predictable probability relative to a defined clock. In the example above, data rates at the 2× rate were found to have data transitions that were fairly evenly distributed between even and odd VCO clock edges at the higher rate. At the lower data rate, data transitions were found to occur generally on one, but not both of the even or odd VCO clock edges. In some situations, however, it has been found that data that is actually at one rate can masquerade as data at another rate. When this happens, it might be possible that the data rate detection can be fooled.

Figure 7:
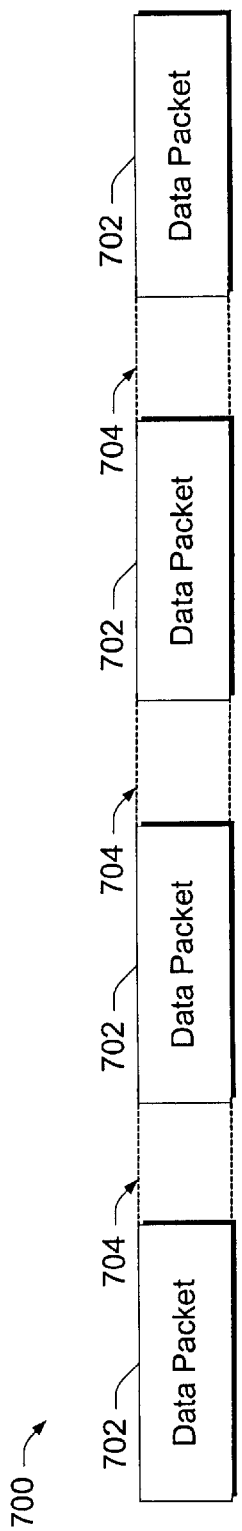
FIG. 7 is a diagram of an exemplary data stream.

In one particular embodiment, the data rate detection circuit is configured so that small bursts of data having an even distribution between even and odd edge data transitions triggers an indication of the higher data rate which is then held for a particular definable duration. The reason for this is as follows. Consider FIG. 7 which shows an exemplary data stream 700 that includes several data packets 702 having control information 704 therebetween. The data packets represent payloads of user data that is being communicated between various systems. The control information 704 contains information that enables the communication link to be established and maintained, as will be apparent to those of skill in the art. The data packets can comprise frames of data that are very long in length (e.g. 2000 bytes) as compared to the length of the control information 704. Consider also that there is a potential for long runs of data where all of the transitions will be on either the even or odd edges even though the data is at the higher rate and will on average have an even mix of even and odd edges. Hence, the predictability that is provided when it can be assumed that the data transitions take place in accordance with defined rules or profiles can be jeopardized (e.g. a long run of data at the higher data rate might not have a transition thereby possibly erroneously indicating that it is data at the lower data rate).

Consider also that the control information 704 generally tends to follow the defined rules or profiles (e.g. even though the control information is generally short in length, if the control information is at the higher rate, then there will generally be an even mix between data transitions at the odd and even VCO clock edges). In accordance with this described embodiment, the data rate detection circuit is configured so that small bursts (~80 bits) of balanced distributions (as would be seen in the control information 704) between data transitions that take place on the even and odd VCO clock edges trigger an indication of the higher data rate that is held for a duration that exceeds the largest frame (packet) time at the higher data rate. Thus, the circuit is configured so that the decision that data is being transmitted at the higher rate has a very short time constant as compared to the time constant that is associated with a decision that the data is being transmitted at the lower data rate. Essentially, then, the circuit responds very quickly to 2× data and very slowly to 1× data.

Use of Transition Density

In another embodiment, the transition density is utilized to ascertain whether data is at a higher or lower data rate. The term "transition density" refers to how often the data transitions between 1's and 0's for a given unit of time. The transition density can be used to ascertain an average, over time, which can then be used to make an intelligent decision as to which data rate is present. Data that is at a higher rate will typically have more transitions per unit time than data that is transmitted at a lower rate.

Figure 8:
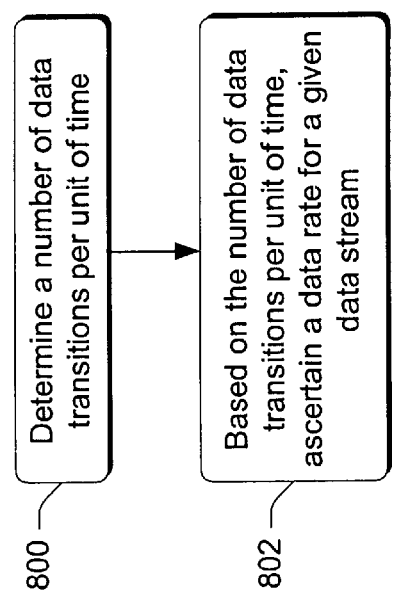
FIG. 8 is a flow diagram that describes steps in a data rate detection method in accordance with a described embodiment.

FIG. 8 is a flow diagram that illustrates a data rate determination method in accordance with this embodiment. This method can be implemented in any suitable hardware, software, firmware or combination thereof In the illustrated example, the method can be implemented in hardware that is suitable for use in connection with high speed data speed transmission.

Step 800 determines a transition density that comprises the number of data transitions per unit of time of a given data stream for which a data rate is desired. This step might be implemented by an integrator circuit that gets pulsed by a phase comparator every time there is a data transition. Step 802 ascertains a data rate for the data stream using the transition density. This step can be implemented using any suitable threshold circuit that might, for example, compare the transition density (or representation thereof such as an input voltage) with a definable threshold.

Run Length Limited Method

In another embodiment, and one that is particularly well suited to Fibre channel systems in which specific rules define that a given data stream can have no more that five 0's or 1's in a row, data rate can ascertained by examining the bit runs or the number of like adjacent bit values. Specifically, lower data rate bit streams can have long runs of 1's and 0's which do not necessarily confirm to the Fibre channel rules governing run length at the higher rate. Accordingly, a data stream at a lower data rate might have ten or more 1's or 0's in a row. For the higher data rate data stream, the Fibre Channel rules will be followed. Thus, if a receiver repeatedly detects runs lengths of 10 bits or more (clocking at the higher data rate), then the incoming data stream can be assumed to be at the lower data rate. Thus, a statistical parameter can be defined that represents the run length of a given data stream. If the parameter is greater than five (at the 2× data rate), then this would indicate lower data rate data. If, on the other hand, the parameter is less than or equal to five, then this would indicate higher data rate data. Yet another method would involve statistically tracking the frequency of runs longer that five (from the higher data rate point of view). Statistics can be maintained on run lengths that are present in the data stream and the relative amount of long run lengths can then be used to determine the data rate.

Conclusion

Methods and systems of determining data rates in systems that include high speed serial data transmission systems are described. In the described embodiments, various statistical approaches are utilized to ascertain the data rate of a given data stream. These methods greatly improve on past methods which, for example, utilized trial and error methods that were prone to errors. The presented methods and systems are robust, accurate and automatically determine data rates in a repeatable manner. In the hardware embodiments, certain circuit optimizations can be made to further refine the data rate determination tolerances of the system.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A clock extraction/data recovery circuit for recovering an embedded clock and data from a high speed serially transmitted data stream, the circuit comprising:

a phase comparator configured to receive a high speed serially transmitted data stream and output indicia whenever the data stream experiences a data transition;

a voltage controlled oscillator (VCO) connected with the phase comparator and configured to provide a clock signal having clock edges, the clock signal being locked to the data stream; and a data rate detection circuit connected with the phase comparator and configured to receive the series of pulses that are output by the phase comparator and ascertain, based on the received pulses, a data rate at which the data stream is transmitted, wherein the data rate detection circuit comprises an edge ratio detector circuit that is configured to ascertain a ratio between data transitions that take place on even clock signal clock edges and odd clock signal clock edges, the ratio providing a measure by which the data rate can be ascertained.

2. The clock extraction/data recovery circuit of claim 1, wherein the data rate detection circuit further comprises a threshold circuit connected with the edge ratio detector circuit, the threshold circuit configured to ascertain from the ratio provided by the edge ratio detector circuit, a likely data rate.

3. A clock extraction/data recovery circuit for recovering an embedded clock and data from a high speed serially transmitted data stream, the circuit comprising:

a phase comparator configured to receive a high speed serially transmitted data stream and output indicia whenever the data stream experiences a data transition;

a voltage controlled oscillator (VCO) connected with the phase comparator and configured to provide a clock signal having clock edges, the clock signal being locked to the data stream; and a data rate detection circuit connected with the phase comparator and configured to receive the series of pulses that are output by the phase comparator and ascertain, based on the received pulses, a data rate at which the data stream is transmitted, wherein the phase comparator comprises a pair of outputs one of which being associated with data transitions that take place on even clock edges, the other of which being associated with data transitions that take place on odd clock edges, the phase comparator being configured to output a pulse via one of the pair of outputs when the data stream experiences a data transition.

4. The clock extraction/data recovery circuit of claim 3, wherein the data rate detection circuit comprises a pair of integrator circuits, one of the integrator circuits being configured to receive pulses from the even clock edge output of the phase comparator, the other of the integrator circuits being configured to receive pulses from the odd clock edge output of the phase comparator, the integrator circuits being configured to provide a measure of transition density of data stream transitions.

5. The clock extraction/data recovery circuit of claim 4, wherein the data rate detection circuit comprises a threshold circuit connected with the pair of integrator circuits, the threshold circuit being configured to ascertain, based on the measure of transition densities provided by the integrators, a likely data rate for the data stream.

* * * * *